United States Patent [19]

Rivoir

[11] Patent Number: 4,751,456
[45] Date of Patent: Jun. 14, 1988

[54] ARRANGEMENT FOR OR IN MOVING IRON OR MOVING COIL INSTRUMENTS

[76] Inventor: Karl H. Rivoir, Am Nagoldhang 5, D-7530 Pforzheim, Fed. Rep. of Germany

[21] Appl. No.: 860,518

[22] Filed: May 7, 1986

[30] Foreign Application Priority Data

May 9, 1985 [DE] Fed. Rep. of Germany ....... 3516684

[51] Int. Cl.⁴ .............................................. G01R 1/00
[52] U.S. Cl. ...................................... 324/155; 29/438; 324/154 PB
[58] Field of Search ............. 324/154 R, 154 PB, 155, 324/150; 292/305; 24/455, 456, 457, 458, 459, 671, 674, 689; 29/437, 438, 439, 440

[56] References Cited

U.S. PATENT DOCUMENTS

| | | | |
|---|---|---|---|
| 1,753,216 | 4/1930 | Pierce, Jr. | 29/438 |
| 2,213,448 | 9/1940 | Morton | 29/438 |
| 2,338,082 | 1/1944 | Brewton | 29/438 |
| 3,033,010 | 5/1962 | Pintarelli | 29/437 |
| 3,052,847 | 9/1962 | Lender | 324/155 |
| 4,505,010 | 3/1985 | Arenhold | 24/456 |

FOREIGN PATENT DOCUMENTS

| | | |
|---|---|---|
| 1516247 | 5/1969 | Fed. Rep. of Germany . |
| 1473697 | 9/1969 | Fed. Rep. of Germany . |
| 1816963 | 7/1970 | Fed. Rep. of Germany . |
| 2532914 | 2/1977 | Fed. Rep. of Germany . |

Primary Examiner—Reinhard J. Eisenzopf
Assistant Examiner—Robert W. Mueller
Attorney, Agent, or Firm—Toren, McGeady & Associates

[57] ABSTRACT

An arrangement for moving coil or iron instruments with an axis and a moving member attached thereto. The moving member is a moving coil or iron designed in the shape of a circular segment and has one or two arms at the axis for retention and for fixing its position. The arm(s) has free ends which exhibit a slit of a particular shape and dimension such that the axis fits into the slit. The free ends are slid in a fork-like manner onto the axis from the side, i.e., approximately perpendicular to the longitudinal direction of the axis. The free ends have prongs defining the slit located on opposite sides next to the axis and are connected to the axis directly or by means of intermediate parts.

18 Claims, 2 Drawing Sheets

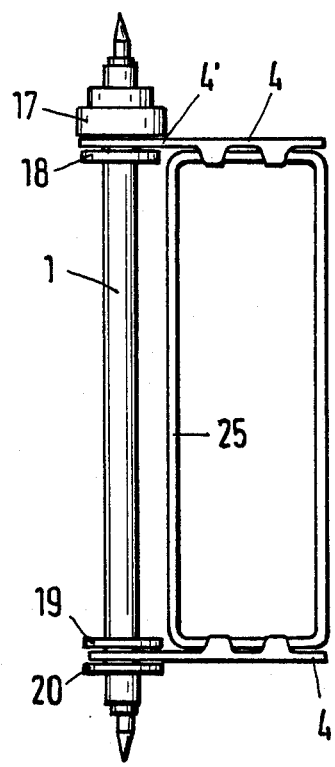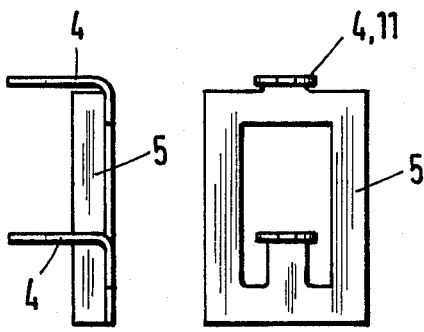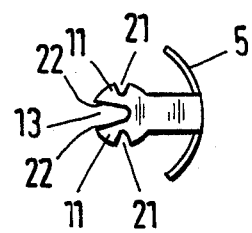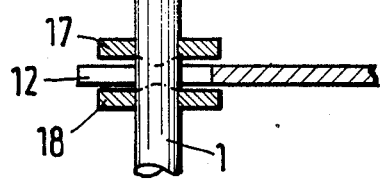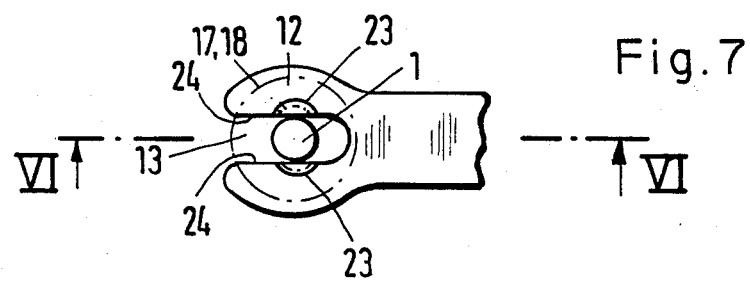

ARRANGEMENT FOR OR IN MOVING IRON OR MOVING COIL INSTRUMENTS

FIELD OF THE INVENTION

The invention is directed to an arrangement for or in moving iron or moving coil and, more particularly, such instruments having an axis and a moving element attached thereto where the moving member comprises one or two arms at the axis for its retention and for fixing its position.

BACKGROUND OF THE INVENTION

Arrangements of instruments (moving iron or moving coil) consisting of an axis and the moving iron or moving coil inclusive of the associated arms attached to the axis, are known from the DE-PS No. 18 16 963. Although the embodiment provided there for the axis has proved itself, the installation of the moving member with its arm at the axis required there is very cumbersome and thus time-consuming and expensive. This is so because this installation has to occur by insertion of the axis into the bores at the ends of the arms. Such a threading-in must be made by hand or it has to be done automatically with very great expense. Both are no longer acceptable because they are considered approaches which have no proper rationale.

Additionally, there is the danger that, in the course of the threading-in operation, the very delicate pivot points impact at the ends of the arms or next to the respective bore and thus could be damaged. Additionally, there is another disadvantage, in that the riveting provided in this previous publication is possible at only one of the arms of the moving member with the collar at the axis, since in view of the previously mentioned requirement of the threading-in operation, one cannot provide two collars at the axis for riveting of both arms of the moving member. If the moving element, however, is riveted solidly only with one arm and if it is retained with the other arm only loosely or with a more or less solid seat at the axis, then this can lead to an unstable attachment of the moving element particularly in the case of larger and thus heavier moving members. This entails an impairment of the reproducibility of the so-called scale characteristic, meaning the respective indication of the moving member. This disadvantage is considerable since these scales must be reproducible because of cost consideration and since it is impossible to fabricate a special scale (after the appropriate graduation) by hand for each moving member. If the moving member is designed as a moving coil, then it has to be added so that, particularly in the case of larger and thus heavier moving coils, such a moving member attached so-to-speak "on one hip", no longer has a sufficient stability because of the coil weight. Only one arm can be riveted on. If another arm exists which cannot be riveted on, then this arm can only be inserted or slid on upon the axis. Then, because of the fabrication tolerances there is the danger of vibration of the moving member with respect to the axis.

In the case of a too solid counter-clamping of the second arm upon the axis there is the danger of distortion. It has also to be taken into account that other components are attached on the axis, such as the indicating cross and the dampening vane and that these parts must have a specific relationship (angular position) in circumferential direction with respect to the moving member. Thus, the moving member must also be adjusted in the circumferential direction during its attachment at the axis. This can result in difficulties during the fabrication in the explained state of the art.

It is indeed known from the DE-PS No. 19 19 244 to insert a small moving iron plate into slits of collars, which are in one piece with the axis according to the DE-PS No. 18 16 963. This permits, however, only an attachment of flat small moving plates extending in radial direction, not, however, the attachment of moving irons in the shape of circular segments and of moving coils, which are both respectively provided with arms for their attachment at the axis. Moving irons in the shape of circular segments are, however, required for many applications. An arrangement according to the above-mentioned patent publication DE-PS No. 19 19 244 thus does not address the thrust of the present invention. Furthermore, this prior arrangement has an additional disadvantage in that, for the adjustment of the moving member in longitudinal direction of the axis in addition to the attachment collars, at least one adjustment stop must be provided at said axis. The attachment of small moving iron plates at the collars occurs only along very small cross-sections and therefore can again detach itself.

Contrary to that, a primary task of the invention is to provide a simpler as well as stable attachment of moving members at the axis which can be accomplished with correspondingly smaller costs, whereby the moving members are designed as moving coils or as circular segment-shaped moving irons respectively with associated arms.

SUMMARY OF THE INVENTION

By the sidewise sliding-on of the parts formed through the slitting (in the following called "prongs" for reasons of simplicity) of the free arm end or of the free arm ends over the axis, the disadvantages and cumbersome threading-in in longitudinal direction of the axis according to the state of the art is avoided and the primary task of the present invention is achieved. This sidewise sliding-on of the prongs requires, on the contrary, considerably shorter displacement travels and can therefore be accomplished with a considerably smaller installation expenditure, because it can be performed relatively easily in a mechanized (automated) manner. The danger of damaging the tips of the axes is eliminated. Since the prongs are located on both sides of the axis they can be attached sufficiently firmly to it, preferably at the collars (to be explained later). The explained danger of an inadequate attachment, as is the case in the arrangement according to DE-PS No. 19 19 244, is eliminated. Preferably the invention is performed with moving members with two arms. In special cases, in particular referring to moving members of relatively small size and thus relatively small weight, only one arm can suffice for their retention. Such moving members can also be provided with the advantages according to the arrangement of the invention.

A preferred embodiment form of the invention is as follows. Two arms can be attached at both collars, preferably they can be attached by mechanical deformation (for instance a caulking or a rivet-like deformation). Other types of attachment, for instance, soldering or gluing, would be possible, in spite of the fact that the mechanical deformation is the preferably attachment here. That such an embodiment of the arrangement consisting of axis and moving member is not possible with the state of the art has been previously explained. Since the prongs of the free ends rest on the sides at the axes and can extend with their tips beyond the axis shaft, the prongs form a sufficiently large contact surface at the respective collar and thus provide sufficient attachment possibilities. Particularly here, the preferred embodiment form of the mechanical deformation is of advantage and indeed in combination and cooperation with the other features of the invention. It is of particular advantage that the sliding-on of the free ends of the arms upon the axis and the connection of these free ends or their prongs with collars of the axis can be performed in a common work process through mechanical deformation, including the appropriate attachment of a pointer support, etc., at the axis. Here, at the same time, the accurate observance of the angular position between pointer support and moving member by appropriate design of the device can be achieved without further ado. The adjustment of the moving member in longitudinal direction of the axis occurs automatically by the collars themselves, so that special adjustment means or devices are not required for this purpose. An additional advantage consists therein, in that a mechanical clamping of sensitive components, in particular of the soft magnetic moving irons, is avoided.

The arms of the moving member can be produced in a simple manner by punching from metal. The arms could, however, also be fabricated from plastic. The axis can be produced from non-ferrous metal, preferably aluminum according to the DE-PS No. 18 16 983, whereby the collars can be fabricated in one piece with the axis at negligible additional cost. This and the explained reduction of the assembly costs (approximately by 40%) yields overall a very considerable reduction of the total fabrication costs of such an arrangement.

The above-mentioned preferred embodiment of the invention concerning the attachment of the free ends of the arms at the collars by mechanical deformation (which could be that of the collars and/or the prongs) can in a specially preferred embodiment form of the invention be an attachment of the following kind. The sliding of the prongs over the axis from the side permits the bringing of the prongs at one end of each arm in between two associated collars without any problems. The attachment of the prongs at these collars and thus at the axis is possible in a particularly easy manner by mechanical deformation, since the prongs of one arm rest on both sides at respectively one collar.

In the above-mentioned mechanical deformation, it is here advantageous from the production technology point of view, that hereby one of the collars rests upon a baseplate of the deformation tool and the other of these collars is pressed in the direction of the baseplate by an appropriate pressure ram or such like of said deformation tool, so that no shear stresses occur in longitudinal direction of the axis.

Other characteristics and advantages of the invention will be understood from the following description and the associated drawings and the scope of the invention will be pointed out in the appended claims.

BRIEF DESCRIPTION OF THE DRAWINGS

In the drawings:

FIG. 4 shows a further embodiment of the invention in side view and partially in section;

FIG. 5a, 5b and 5c illustrate a moving iron according to the invention in side view, in front view and plan view, which can be connected with an axis in FIG. 4 instead of the there shown moving coil frame;

FIG. 6 shows a further embodiment example of the invention in partial presentation and in longitudinal section and in a section along the line VI—VI in FIG. 7; and FIG. 7 illustrates a plan view according to a section along the line VII—VII in FIG. 6.

DESCRIPTION OF THE PREFERRED EMBODIMENTS

Figure 1:
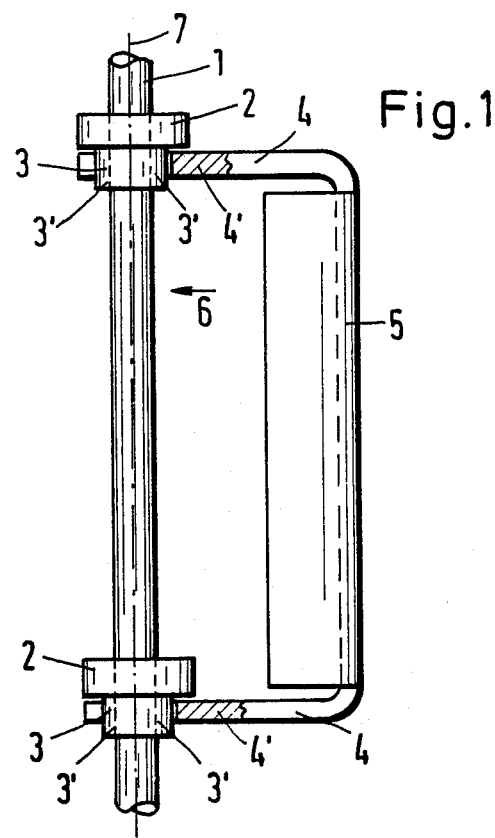
FIG. 1 illustrates a first embodiment example of the invention in side view, partially in longitudinal section.

The axis 1 of such a measuring mechanism has, according to FIG. 1, two collars 2 turned on a lathe with shoulders or steps 3 with smaller diameters than said collars. On these shoulders, the arms 4 of a moving iron 5, which has a circular segment-shaped cross-section according to FIG. 3 (and also FIG. 5c), are slid on. The embodiment examples deal with the preferred embodiment of the invention, namely, where the moving element is retained by means of two arms. An embodiment with only one arm would, however (see above), be possible in the discussed special cases. The following discussion applies also for that case as far as this is concerned.

The free ends 4' of the arms 4 form, in principle, in all embodiment examples a sort of fork with two prongs 8 (FIG. 2a), 9 (FIG. 2b), 10 (FIG. 3), 11 (FIGS. 5a–5c) and 12 (FIGS. 6 and 7). In principle, this means that each of these prong embodiments can, in the sense of the invention, be slid over one of the depicted axes from the side, meaning according to arrow 6 perpendicularly to the longitudinal direction 7 of the axis 1, being slid on the same and connected with said axis. The only assumption is that the axis (or in the embodiment example of FIG. 1, the shoulders 3) fit at the appropriate place in between the prongs, as it has also been respectively drawn in, in broken lines. Hereby, a particularity concerning the prongs 10 in the embodiment example of FIG. 3 is that the width of the slit 13 must be so large, that one can slide the prongs 10 over the axis 1. The diameter of the keyhole-like recess 14 must be so large, that subsequently these ends 4' of the arms 4 can be slid somewhat from the bottom towards the top over the shoulders 3. From that, the edges 3' of these shoulders are bent over towards the top, externally in a rivet-like manner (not depicted) and thus they retain the arms 4 solidly at the collars 2.

Figure 2A:
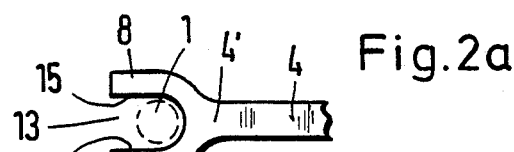
FIG. 2a, 2b, and 3 illustrates possible embodiments of the free ends of the arms of the moving member in plan view.
Figure 2B:
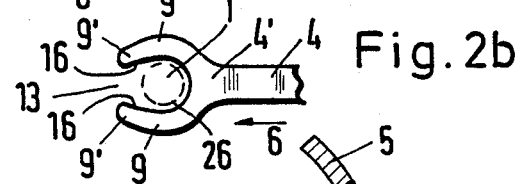
Figure 3:
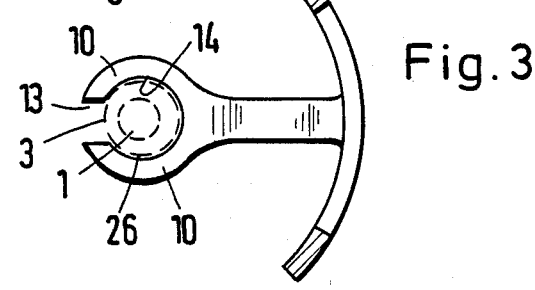

In the embodiment example of FIG. 2a, the internal sides 16 of the two prongs 6 extend approximately parallel to each other, while in the embodiment example of FIG. 2b, the corresponding internal sides 16 of the prongs 9 converge somewhat towards their tips 9'. Assuming that the material of the arms is somewhat elastic, the sliding-in operation in arrow direction 6 over the axis 1 can occur with a spreading apart of the tongues 9 with a snap-in or detent effect, whereby then the prongs 9 retain the arms 4 or their ends 4' through spring-back effect by means of their proper action as a spring in the depicted position at the axis 1, which is located in a widened receiving area 26 of the slit 13. Then, it is, however, advisable to provide a security of the moving part in circumferential direction of the axis with respect to the same, for instance, as a positively locking rotational safety. It is also possible to provide an additional attachment of the ends 4' at the axis 1, for instance, at the collars of this axis, preferably by means of a mechanical deformation in accordance with the other embodiment examples. It is true, in principle, that the features of one embodiment example or one component of one embodiment example can also be provided in another embodiment example, or in cooperation with other components of a further embodiment example.

The attachment of the ends 4' of the arms 4 at the axis does not have to occur by mechanical deformation. This can also be accomplished in another way, for instance, by welding.

The embodiment example in FIG. 4 shows, first of all, how the free ends 4' of the arms 4 are respectively slid in between two pairs of associated collars 17, 18 or 19, 20 and are connected therewith in a manner to be explained later. Apart from that, FIG. 4 shows how the arms 4 can retain the frame 25 of a moving coil.

The also slit ends 4' terminate, as already explained, in one of the prong pairs 8–12 and rest thus at the sides of the shaft of the axis 1. In this embodiment example, they are also fastened by mechanical deformation at the respectively associated collar pairs 17, 18 or 19, 20. This can be done by simple pressing together of the two collars of each pair or, also, by means of an embodiment form of the invention described subsequently. In this connection it is, however, advisable to select the distance between two collars of a pair to be only slightly larger than the thickness of the prongs.

According to the embodiment example in FIGS. 5a–5c, each of the prongs has an external recess 21 into which the material of one or both associated prongs located above or beneath is pressed in. With this, not only is the desired fastening accomplished but also, at the same time, a perfect security against unwanted turning of the moving member in circumferential direction with respect to the axis is achieved. FIG. 5c shows, in this connection, that the inner surface 22 of the prongs can diverge towards the outside in order to facilitate the sliding operation over the axis. For the mechanical deformation between the two collars of each pair and the prongs, it is advisable to fabricate respectively one collar of a pair to have thinner walls than the other collar, so that it can be pressed into the recess 21 with a correspondingly smaller force. Here, the moving member has to be secured only against a displacement of the slit, generally designated in the figures with 13, relative to the axis 1. The shaping of the slit 13 is not limited to the illustrated embodiment examples.

The embodiment example of FIGS. 6 and 7 shows that recesses 23, analogous to the recesses 21, can also be located at the internal sides 24 of the associated prongs 12. Into these, the material of one or both collars (here designated with 17, 18) is pressed in as has been sketched in broken dotted lines. In FIG. 7, these collars are only illustrated in broken dotted lines.

It results from the embodiment examples, in particular the previously discussed FIGS. 6 and 7, that the mechanical deformation including the riveting operation will be performed at two opposite sides of the collars because of fabrication reasons, however, not in such a manner that this deformation embraces the axis 1 in a circular-annular shape.

While the foregoing description and drawings represent the preferred embodiments of the present invention, it will be obvious to those skilled in the art that various changes and modifications may be made therein without departing from the true spirit and scope of the present invention.

What is claimed is:

1. In an arrangement for use with moving iron or moving coil instruments with an axis and a moving member attached thereto, said moving member being a moving coil or moving iron which is designed in the shape of a circular segment and wherein the moving member comprises at least one arm for its retention and for fixing its position at the axis, the improvement comprising that the arm has a generally flat free end extending transversely of said axis, said free end of the arm being fork-shaped having a pair of laterally spaced prongs defining a slit shaped to engage said axis with said prongs at least partially enclosing said axis, said slit in said free end is slidable onto the axis transversely of the direction of said axis, said prongs defining the slit are connected to said axis for rotation therewith.

2. The arrangement of claim 1, wherein said moving member comprises two arms each having a free end, each free end having prongs formed by a slit for connection to said axis.

3. The arrangement of claim 1 or 2, wherein the prongs are directly connected to said axis.

4. The arrangement of claim 1 or 2, wherein the prongs are connected to said axis by means of intermediate parts.

5. The arrangement according to claim 2, including a collar for fastening of the moving member being attached at the axis, and wherein an additional collar is provided at the axis and wherein said two arms are attached at these two collars with the prongs of their free ends, wherein this attachment occurs through a mechanical deformation of at least one of the prongs and the collars.

6. The arrangement of claim 5, wherein the collar is constructed as one piece with the axis.

7. The arrangement according to claim 5, wherein the material deformations of at least one of the prong and collars are only located at two opposite sides of the axis.

8. The arrangement according to claim 5, wherein the axis and the collars are formed of a non-ferrous metal.

9. The arrangement according to claim 8, wherein the non-ferrous metal is aluminum.

10. The arrangement according to claim 2, wherein the prongs of the free ends form a receiving area for the axis widened with respect to the respective slit.

11. The arrangement according to claim 2, wherein the prongs of both arm ends are designed to be flexible and are slid over the axis with a snap-in or detent manner.

12. The arrangement according to claim 2, wherein the arms are punched from metal.

13. The arrangement according to claim 5, wherein two associated collars are attached spaced from each other at the axis for attachment of each free end of the arm, said spacing approximately corresponding to the prong thickness and which permits sliding of the prongs in between these two collars with simultaneous side contact of the prongs next to the axis or shoulders of the axis and such attachment being made by the mechanical deformation between the respective prongs of the free end and of one collar or both collars of the associated pair of collars.

14. The arrangement according to claim 13 wherein, in a pair of associated collars, one of the collars is designed to be thinner than the other collar.

15. The arrangement according to claim 7 or 8, wherein at least one prong of at least one free end exhibits at least one recess and that deformed material of one collar is located pressed into the respective recess.

16. The arrangement according to claim 1, wherein the prongs of the free arm end form a receiving area for the axis widened with respect to the slit.

17. The arrangement according to claim 1, wherein the prongs of the free end are designed to be flexible and are slid over the axis with a snap-in or detent effect.

18. The arrangement according to claim 1, wherein the arm is punched from metal.

* * * * *